(12) United States Patent
Nakata

(10) Patent No.: US 8,822,241 B2
(45) Date of Patent: Sep. 2, 2014

(54) METHOD OF MANUFACTURING A SEMICONDUCTOR DEVICE

(75) Inventor: Kazunari Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/981,796

(22) Filed: Dec. 30, 2010

(65) Prior Publication Data

US 2011/0294233 A1 Dec. 1, 2011

(30) Foreign Application Priority Data

May 31, 2010 (JP) ................... 2010-124391

(51) Int. Cl.
H01L 21/66 (2006.01)

(52) U.S. Cl.
USPC ............ 438/16; 257/E21.521; 438/7; 438/14; 438/17

(58) Field of Classification Search
USPC .................. 257/E21.521; 438/7, 14, 16, 17
See application file for complete search history.

(56) References Cited

U.S. PATENT DOCUMENTS

| | | | | |
|---|---|---|---|---|
| 5,035,087 | A * | 7/1991 | Nishiguchi et al. | 451/14 |
| 5,433,651 | A * | 7/1995 | Lustig et al. | 451/6 |
| 5,838,448 | A * | 11/1998 | Aiyer et al. | 356/632 |
| 6,437,868 | B1 | 8/2002 | Coult et al. | |
| 7,848,844 | B2 * | 12/2010 | Nemoto | 700/164 |
| 2002/0193899 | A1 | 12/2002 | Shanmugasundram et al. | |
| 2005/0191858 | A1 * | 9/2005 | Fukunaga et al. | 438/691 |
| 2005/0227587 | A1 | 10/2005 | Yang | |
| 2005/0260829 | A1 | 11/2005 | Uematsu et al. | |
| 2008/0268752 | A1 | 10/2008 | Nemoto | |
| 2009/0247050 | A1 | 10/2009 | Arisa et al. | |

FOREIGN PATENT DOCUMENTS

| | | |
|---|---|---|
| CN | 101402178 A | 4/2009 |
| DE | 10 2009 011 491 A1 | 10/2009 |
| JP | 2-222533 | 9/1990 |
| JP | 2-274459 | 11/1990 |
| JP | 4-354673 A | 12/1992 |
| JP | 7-235520 A | 9/1995 |
| JP | 2001-300847 | 10/2001 |
| JP | 2003-234315 | 8/2003 |
| JP | 2005-332982 | 12/2005 |
| JP | 2007-220775 A | 8/2007 |
| JP | 2008-62364 | 3/2008 |
| JP | 2008-264913 A | 11/2008 |
| JP | 2009-90389 A | 4/2009 |

(Continued)

OTHER PUBLICATIONS

U.S. Appl. No. 12/827,259, filed Jun. 30, 2010, Nakata, et al.

(Continued)

Primary Examiner — Asok K Sarkar
(74) Attorney, Agent, or Firm — Oblon, Spivak, McClelland, Maier & Neustadt, L.L.P.

(57) ABSTRACT

Provided is a method of manufacturing a semiconductor device, which includes the steps of: (a) preparing a processing target including a wafer (21) and a protective member (24) formed on the wafer (21); (b) measuring a thickness of the protective member (24) at a plurality of points; and (c) setting a desired value of a total thickness of the wafer (21) and the protective member (24) based on measurement results at the plurality of points to grind the wafer (21) in accordance with the desired value.

8 Claims, 10 Drawing Sheets

(56) References Cited

FOREIGN PATENT DOCUMENTS

| JP | 2009-99788 | 5/2009 |
| JP | 2009-111238 | 5/2009 |
| JP | 2010-17787 A | 1/2010 |
| JP | 2010-040821 | 2/2010 |
| JP | 2010/067 805 A | 3/2010 |

OTHER PUBLICATIONS

U.S. Appl. No. 13/231,198, filed Sep. 13, 2011, Nakata, et al.
Korean Office Action with partial English translation issued May 14, 2012, in Korean Patent Application No. 10-2011-0041316.
German Office Action dated Jun. 6, 2012 issued in German couterpart application No. 10 2011 017 813.9, with English Translation.
Japanese Office Action issued Oct. 16, 2012 in Patent Application No. 2010-124391 with English Translation.
Japanese Office Action Issued Feb. 5, 2013 in Patent Application No. 2010-124391 (with partial English translation).
Combined Chinese Office Action and Search Report Issued Apr. 18, 2013 in Patent Application No. 201110038178.1 (with English Translation).
Office Action issued Oct. 23, 2013, in Chinese Patent Application No. 2011100381781 (with English Translation).
Office Action issued May 6, 2014 in Chinese Patent Application No. 201110038178.1 (with partial English Translation).

\* cited by examiner

F I G . 1
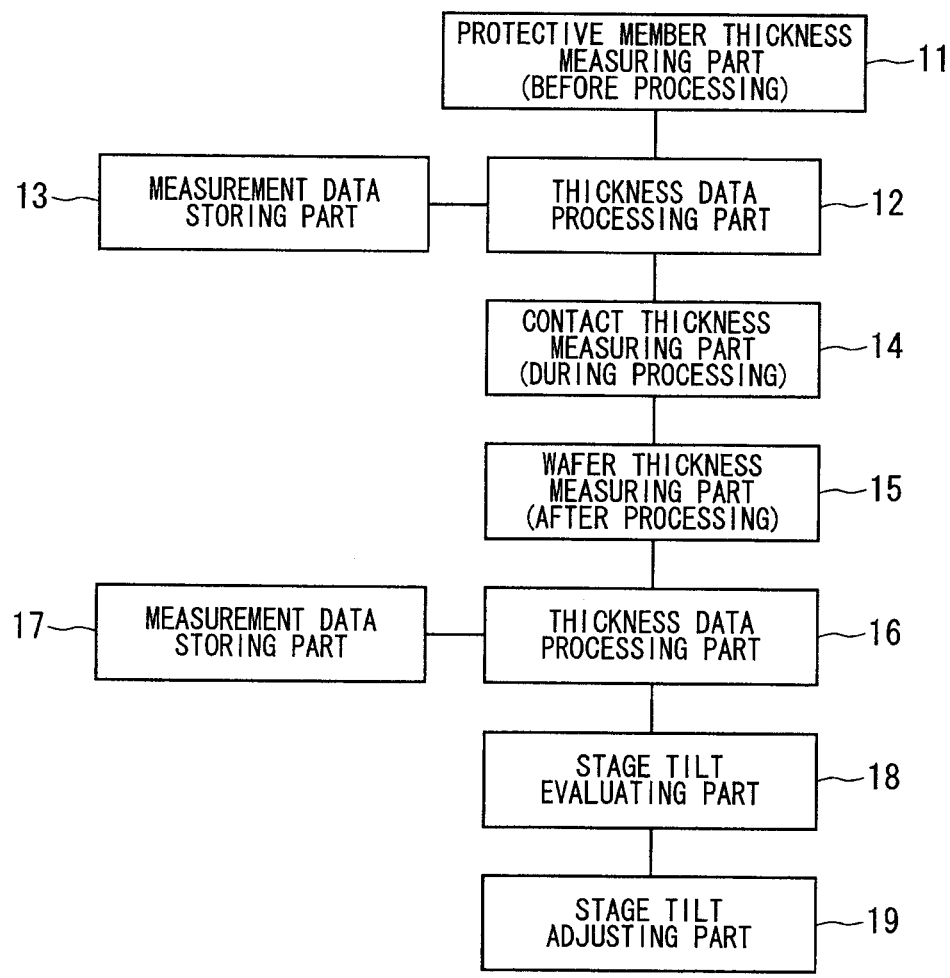

F I G . 4
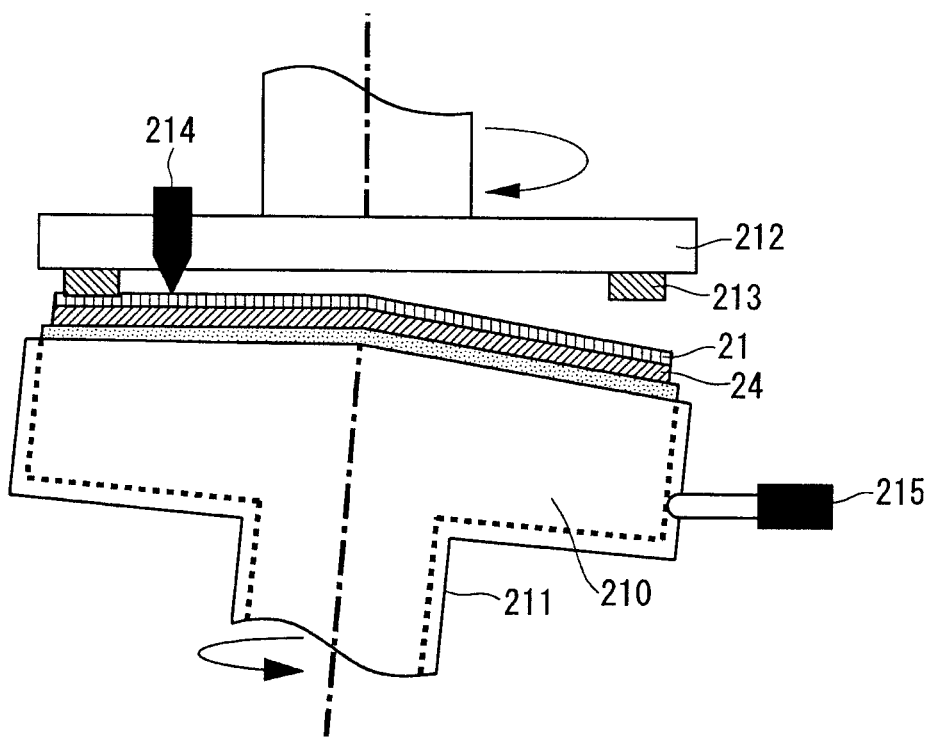

F I G . 8
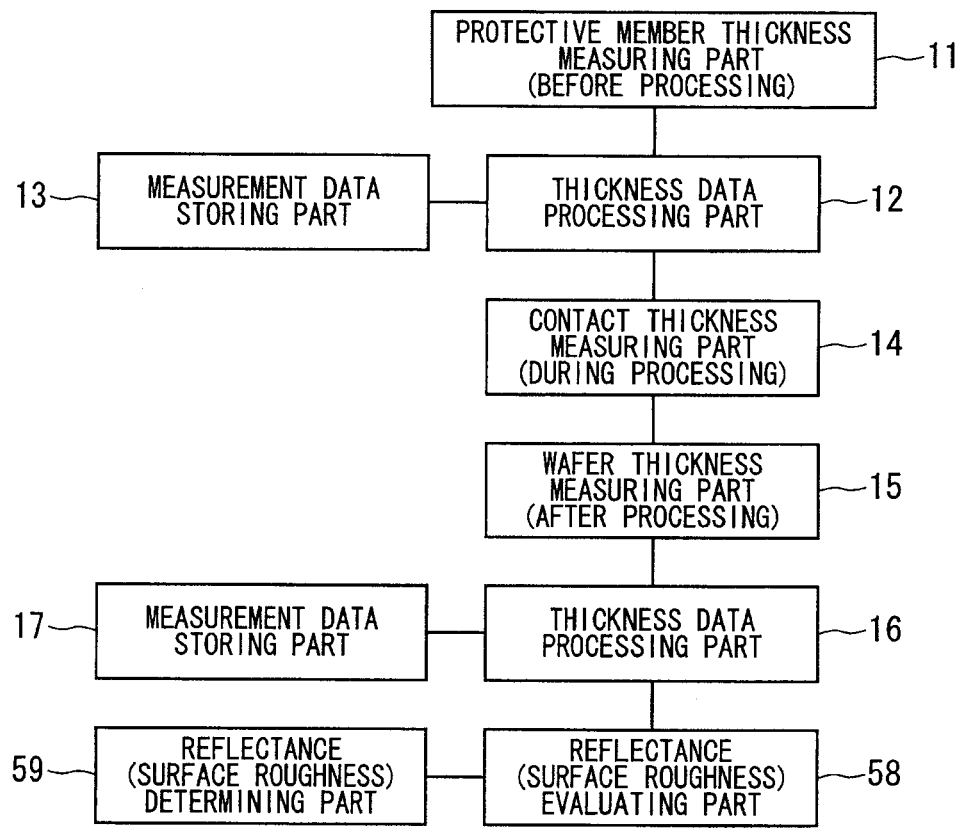

F I G . 9
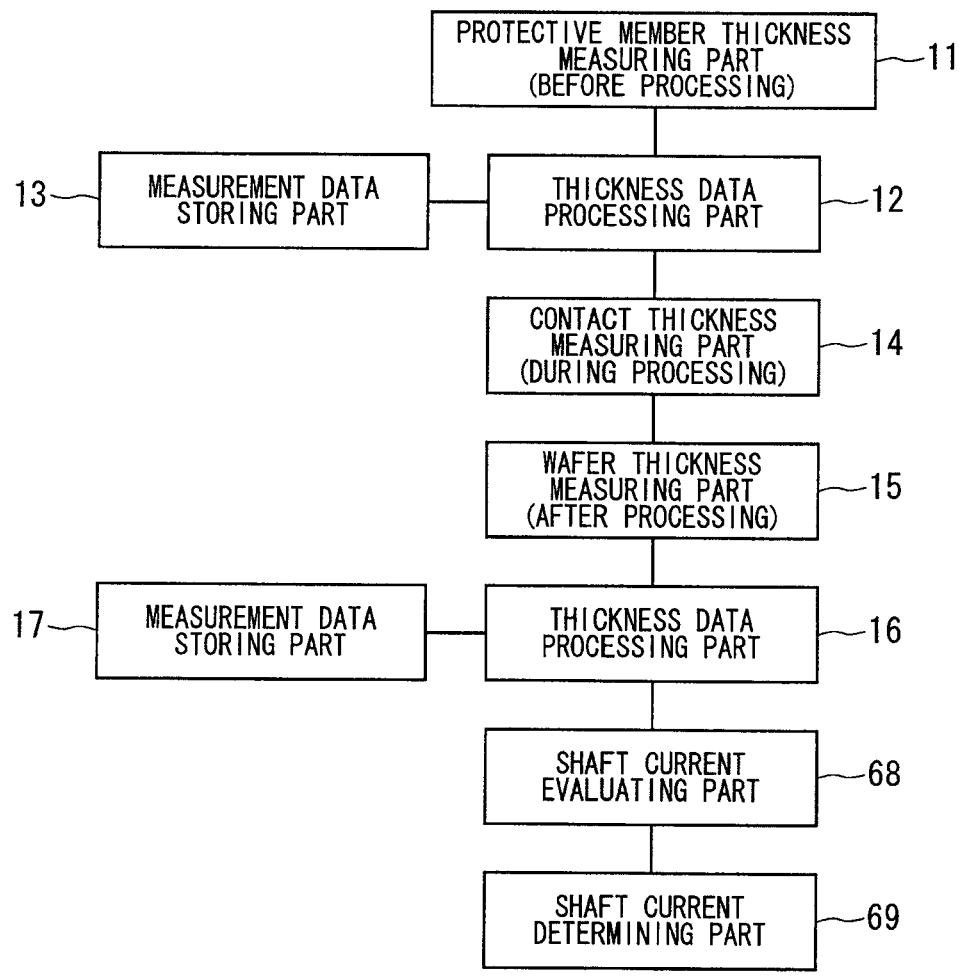

METHOD OF MANUFACTURING A SEMICONDUCTOR DEVICE

BACKGROUND OF THE INVENTION

1. Field of the Invention

The present invention relates to a method of manufacturing a semiconductor device, and more particularly, to a process control method in wafer grinding capable of processing a wafer thickness with high accuracy.

2. Description of the Background Art

In manufacturing a semiconductor device, higher density of a package is pursued in LSI by three-dimensional packaging, and a wafer becomes thinner such that a wafer thickness is approximately 25 μm at the completion of the process.

In power devices such as an insulated gate bipolar transistor (IGBT) and a MOS field-effect transistor (MOSFET), power semiconductor devices are widely used as inverter circuits for industrial motors or automobile motors, a power supply device of a large-capacity server, and a semiconductor switch for an uninterruptible power supply device or the like. In those power semiconductor devices, a semiconductor substrate is processed to be thin for improving conduction performance such as on-state characteristics.

Nowadays, for improvements in cost and characteristics, devices are manufactured from wafer materials manufactured by the floating zone (FZ) method, with the use of an extra-thin wafer process in which a wafer is made thinner to approximately 60 μm.

Typically, in processing a wafer thinner, there is used wet etching or dry etching for removing processing distortions generated in polishing by back grinding or polishing and mechanical polishing, and then an electrode is formed on a back surface side by diffusion layer formation using ion implantation or thermal treatment, sputtering or the like.

In that case, for example, a protective tape mainly formed of polyethylene terephthalate (PET) is conventionally used as a reinforcing member of a thinner wafer, and along with the wafer becoming thinner, the protective tape becomes thicker to approximately several hundreds of μm for ensuring the strength. Further, in recent years, there has been proposed the method of bonding a wafer to a support plate using a glass material and then performing the steps following mechanical polishing because the protective tape cannot withstand treatment, and a wafer warps or deflects considerably by reinforcement with a protective tape.

In using a protective member, the device performance is influenced by the wafer thickness after the wafer is processed to be smaller, and thus the protective member becomes thicker, whereas precise thickness control is required for wafers.

To cope with the problem in which the wafer thickness is required to be controlled with high accuracy as described above, Japanese Patent Application Laid-Open No. 2001-300847 proposes the technique of mounting optical measurement means onto a grinding machine to accurately measure a wafer thickness in grinding.

Further, Japanese Patent Application Laid-Open No. 2009-111238 proposes the method of measuring a thickness in which a grinding fluid or a grinding material scattered in wafer grounding is prevented from becoming an obstacle to thickness measurement by means of a cover that covers a cleaning nozzle and an optical system.

In the above-mentioned grinding methods, it is possible to control a wafer thickness at one point in a plane or on a circumference with a uniform radius, but control of the thickness distribution in a wafer is not considered. Accordingly, in a case where a conventional grinding method is used, there is a drawback that an average value of the thickness falls out of a desired value.

Further, also in a case where a tilt of a stage to which a wafer sticks fast or a tilt of a grinding stone for grinding a wafer falls out of desired value as the number of processing pieces increases, such tilt cannot be detected by a conventional method, leading to a problem that in-plane uniformity of wafer thickness becomes worse.

SUMMARY OF THE INVENTION

An object of the present invention is to provide a method of manufacturing a semiconductor device capable of controlling a wafer thickness with accuracy and improving the in-plane uniformity of a wafer.

According to the present invention, a method of manufacturing a semiconductor device includes the steps of: (a) preparing a processing target including a wafer and a protective member formed on the wafer; (b) measuring a thickness of the protective member at a plurality of points; and (c) setting a desired value of a total thickness of the wafer and the protective member based on measurement results at the plurality of points to grind the wafer in accordance with the desired value.

According to the method of manufacturing a semiconductor device of the present invention, the thickness of the protective member is measured with accuracy, and the total thickness of the thickness of the protective member and the thickness of the wafer is determined with accuracy. Therefore, the thickness of the wafer can be controlled appropriately, which enables improvement of in-plane uniformity of the wafer.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows a configuration of a grinding machine that is a semiconductor manufacturing apparatus according to a first preferred embodiment;

FIG. 4 is a side view showing a state of grinding in the method of manufacturing a semiconductor device according to the first preferred embodiment;

FIG. 8 shows a configuration of a grinding machine that is a semiconductor manufacturing apparatus according to a third preferred embodiment;

FIG. 9 shows a configuration of a grinding machine that is a semiconductor manufacturing apparatus according to a fourth preferred embodiment;

DESCRIPTION OF THE PREFERRED EMBODIMENTS

A. First Preferred Embodiment (A-1. Configuration)

Figure 2:
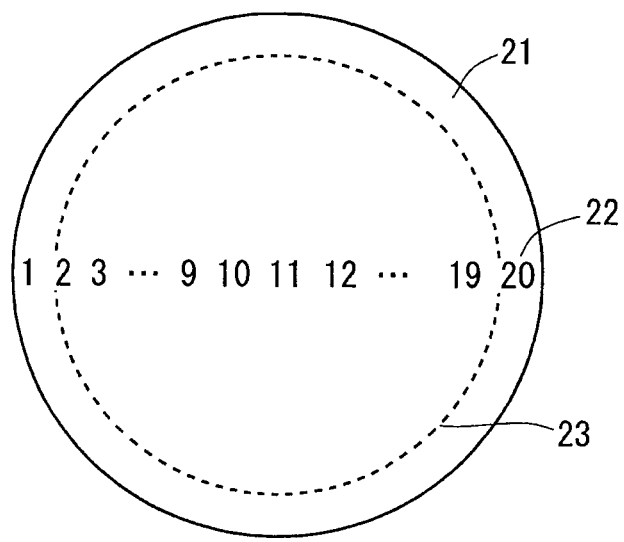
FIG. 2 shows a state of measurement points of a protective member in a method of manufacturing a semiconductor device according to the first preferred embodiment.

FIG. 1 shows the configuration of a grinding machine that is a semiconductor manufacturing apparatus according to a first preferred embodiment of the present invention. With reference to FIG. 1, a protective member thickness measuring part 11 measures the thickness of protective members such as a tape and a glass substrate at a plurality of points, and outputs protective member thickness data. A thickness data processing part 12 calculates an average thickness using the protective member thickness data output from the protective member thickness measuring part 11. The calculation results are output as protective member average thickness data.

The protective member average thickness data calculated by the thickness data processing part 12 is stored in a measurement data storing part 13. A contact thickness measuring part 14 measures a total thickness of the thickness of a wafer during and the thickness of the protective member grinding processing. In this case, the protective member average thickness data stored in the measurement data storing part 13 is referred to as the thickness of the protective member.

A wafer thickness measuring part 15 measures the wafer thickness after processing at a plurality of points, and outputs wafer thickness data. Then, a thickness data processing part 16 calculates an average thickness and the in-plane thickness distribution of the wafer using the wafer thickness data output from the wafer thickness measuring part 15.

The calculated wafer average thickness data and wafer thickness distribution data are stored in a measurement data storing part 17. A stage tilt evaluating part 18 calculates a stage tilt from the wafer average thickness data and wafer thickness distribution data stored in the measurement data storing part 17.

A stage tilt adjusting part 19 adjusts the stage tilt based on the stage tilt calculated by the stage tilt evaluating part 18.

(A-2. Operation)

A grinding process according to the first preferred embodiment of the present invention is described with reference to FIG. 1. First, a wafer and a protective member to be processed are prepared, and as shown in FIG. 1, the protective member thickness measuring part 11 measures the thickness of a tape and a glass substrate that serve as the protective member bonded to the wafer to be ground. As shown in FIG. 2, as to the protective member, not only a measurement point 23 having a constant radius but also a plurality of measurement points 22 are measured in a radial direction in the wafer 21. Here, it suffices that the protective member has such a thickness as to correct a warp or deflect of a thinned wafer. For example, it is possible to use a glass substrate having a thickness of approximately 700 μm that is used in a liquid crystal display panel.

Figure 3:
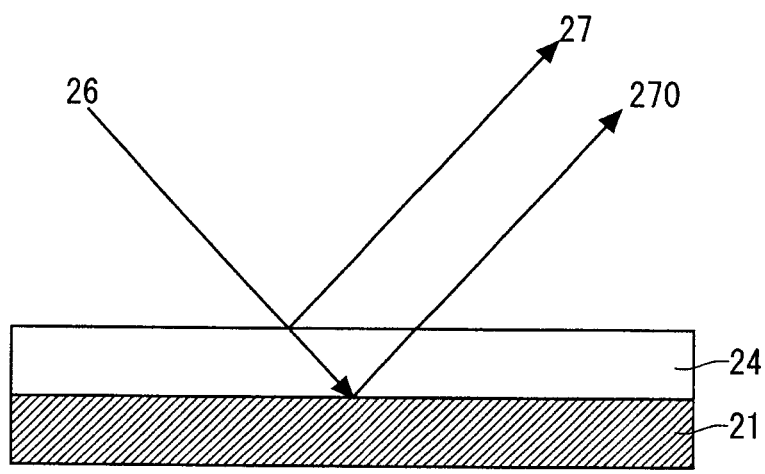
FIG. 3 shows a method of measuring a thickness of the protective member in the method of manufacturing a semiconductor device according to the first preferred embodiment.

As a method of measuring the thickness of the protective member, for example, the method as shown in FIG. 3 can be used, in which an incident light beam 26 for measurement is caused to enter a plane of a protective member 24 for the wafer 21, which is not in contact with the wafer 21, whereby it is possible to measure the thickness of the protective member 24 from the interference of a reflected light beam 27 from a front surface of the protective member 24 and a reflected light beam 270 from a back surface thereof.

The thickness data processing part 12 calculates an average thickness based on the protective member thickness data of the protective member 24, and outputs the calculated average thickness as the protective member average thickness data. The protective member average thickness data is stored in the measurement data storing part 13.

After that, the protective member 24 and the wafer 21 are conveyed to a processing table of the grinding machine and is subjected to grinding with a grinding stone. The grinding is performed as shown in FIG. 4. The wafer 21 is conveyed onto and placed on a suction stage 210 as a stage, and is sucked to the suction stage 210 by, for example, vacuum suction. Then, the entire suction stage 210 rotates as indicated by an arrow of FIG. 4. Here, the suction stage 210 is covered with a protective member cover 211.

Then, a grinding wheel 212 to which a grinding stone 213 as a grinding member is provided is lowered onto the wafer 21 while being rotated from above in FIG. 4. The grinding is started by the grinding stone 213 when the grinding stone 213 is brought into contact with the wafer 21.

Figure 5:
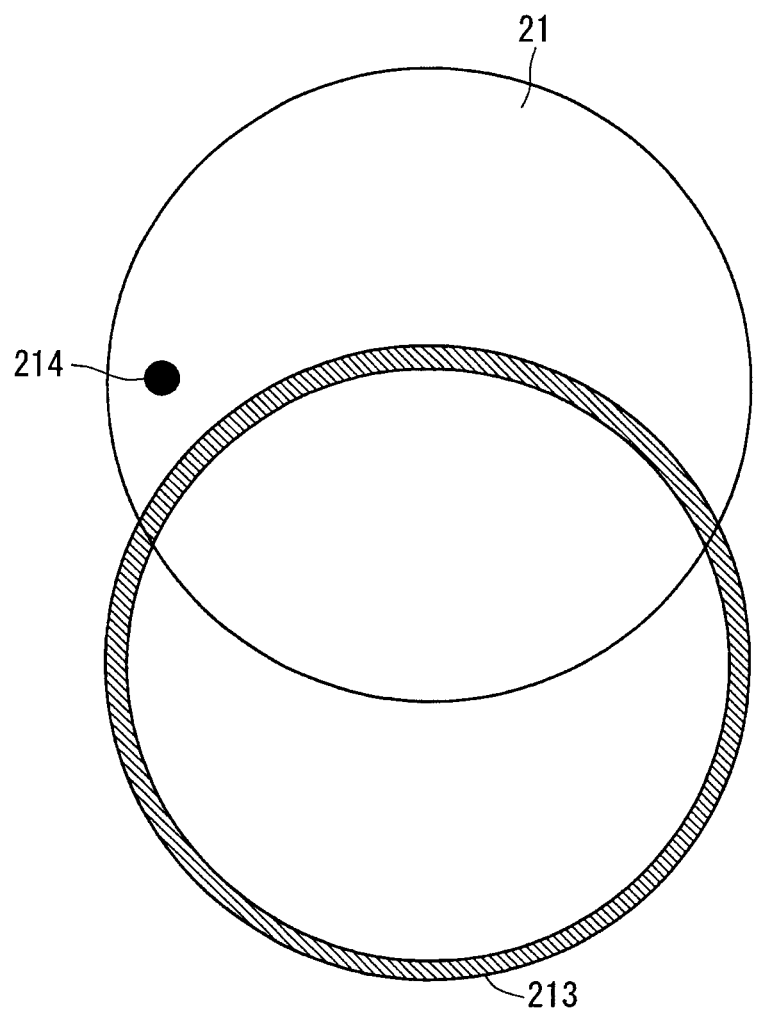
FIG. 5 is a top view showing the state of grinding in the method of manufacturing a semiconductor device according to the first preferred embodiment.

FIG. 5 is a view in a case where the configuration of FIG. 4 is viewed from above. The wafer 21, the grinding stone 213 and a contact thickness measuring device 214 have the positional relationship as shown in FIG. 5.

The thickness of the wafer 21 including the protective member 24 during processing can be appropriately monitored with the contact thickness measuring device 214. A target value (desired value) of the contact thickness measuring device 214 when grinding is stopped is determined from the targeted final thickness of the wafer 21 and the average thickness of the protective member 24 based on the protective member average thickness data.

With the above-mentioned configuration, even when the protective member 24 has the in-plane thickness distribution, it is possible to perform grinding such that the average value of the wafer 21 thickness to be equal to the target value (desired value) by grinding in consideration of the protective member average thickness data that is an average value thereof.

Next, the wafer 21 with the protective member 24 that has been ground to have a desired thickness is conveyed to the wafer thickness measuring part 15. In the wafer thickness measuring part 15, non-contact thickness measuring means measures the thickness at a plurality of points in the radial direction in the wafer 21 with the use of, for example, the interference with a laser as shown in FIG. 3 and outputs the measured thickness as the wafer thickness data. In this case, however, the positional relationship between the wafer 21 and the protective member 24 is different from the case shown in FIG. 3 (that is, opposite thereto), and thus the thickness of the wafer 21 is measured from the interference using the reflected light beams from the front surface and the back surface of the wafer 21.

In measurement, from the perspective of the light transmittance, a laser beam having a wavelength of approximately 1.3 μm is used in a case of silicon. Alternatively, in order to eliminate the effects due to the pattern formed on the surface of the wafer 21, an upper limit and a lower limit of the thickness of the wafer 21 may be set in advance by the thickness data processing part 16. As a result, in the cases where the upper limit is exceeded and the lower limit is not exceeded, values in those cases can be excluded from the measurement values.

After that, the thickness data processing part 16 calculates the wafer average thickness data and the wafer thickness distribution data based on the wafer thickness data. The wafer average thickness data and wafer thickness distribution data calculated by the thickness data processing part 16 are approximately stored in the measurement data storing part 17.

The wafer average thickness data and the wafer thickness distribution data are evaluated by the stage tilt evaluating part 18. As to the in-plane wafer thickness, in a case where a difference between a maximum value and a minimum value thereof is larger than a set value set in advance, the tilt of the suction stage 210 is adjusted by the stage tilt adjusting part 19 including a stage tilt adjusting mechanism 215 using, for example, a micrometer as shown in FIG. 4.

Figure 6A:
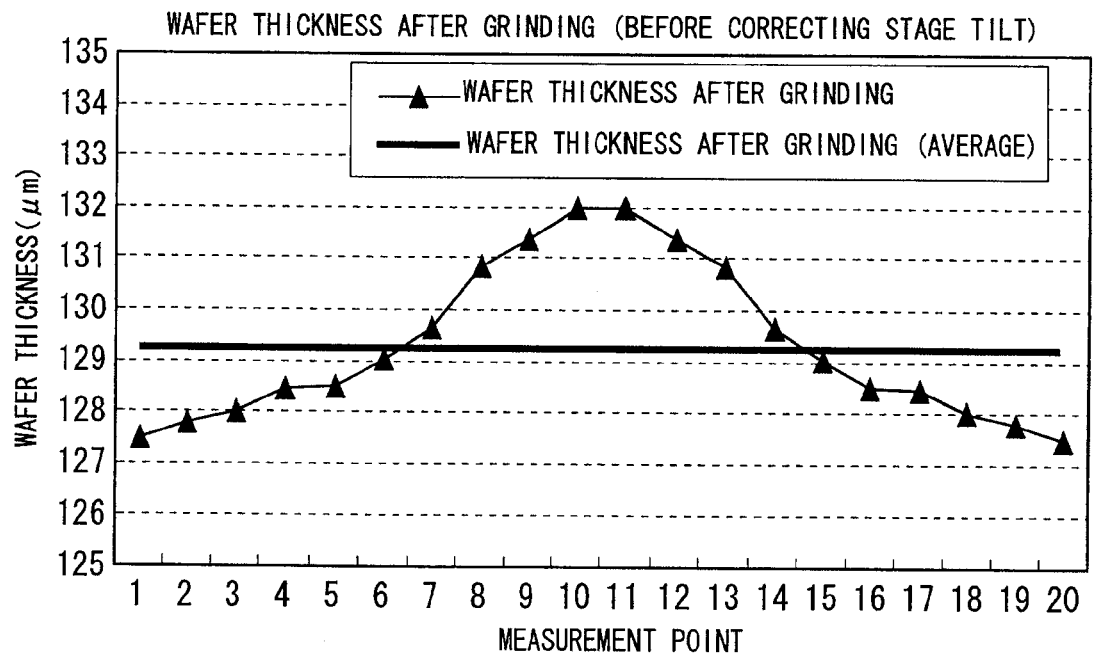
FIGS. 6A and 6B show the distribution of a wafer thickness before and after adjusting a stage tilt in the method of manufacturing a semiconductor device according to the first preferred embodiment.

FIG. 6A shows the in-plane thickness distribution of the wafer 21 before the stage tilt is adjusted in the first preferred embodiment of the present invention. Meanwhile, FIG. 6B shows the in-plane thickness distribution (TTV) of the wafer 21 in the case where the stage tilt is adjusted by the stage tilt adjusting mechanism 215 from the in-plane thickness distribution of the wafer after grinding.

Figure 6B:
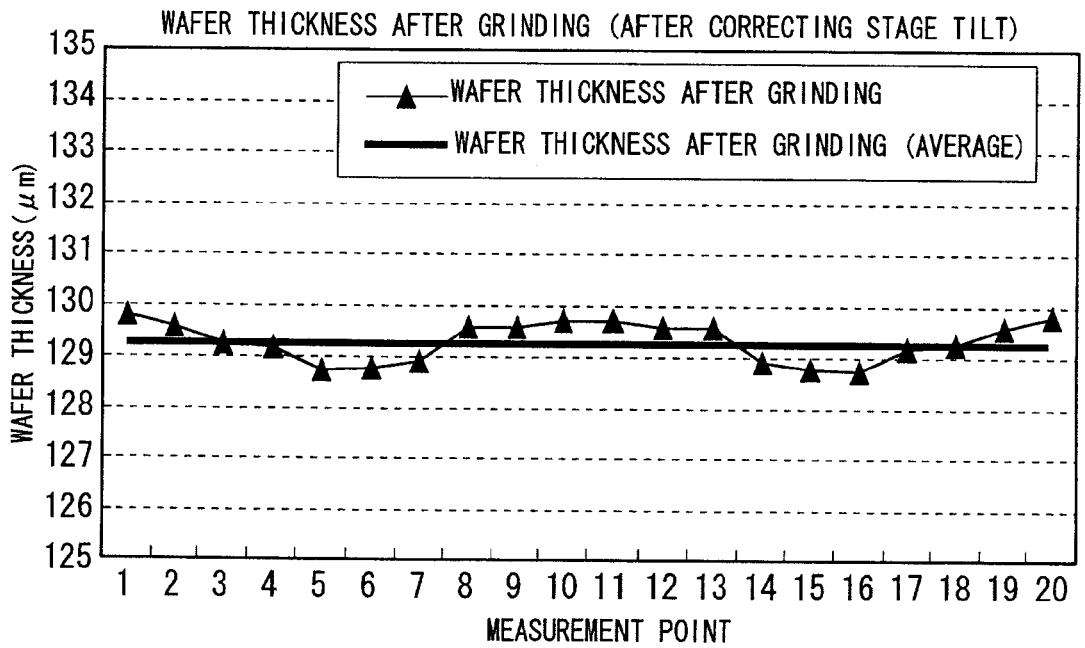

It is revealed that the distribution width is approximately 4.5 μm in FIG. 6A while the distribution width is improved to approximately 1.2 μm in FIG. 6B.

It is possible to increase the measurement accuracy of the thickness of the protective member 24 and the wafer 21 in the first preferred embodiment by performing measurement at the same point a plurality of times.

(A-3. Effects)

According to the first preferred embodiment of the present invention, a method of manufacturing a semiconductor device includes the steps of: (a) preparing a processing target including the wafer 21 and the protective member 24 formed on the wafer 21; (b) measuring the thickness of the protective member 24 at a plurality of points; and (c) setting a desired value of a total thickness of the wafer 21 and the protective member 24 based on measurement results at the plurality of points to grind the wafer 21 in accordance with the desired value. Accordingly, the thickness of the protective member 24 can be measured with accuracy, and the total thickness of the thickness of the protective member 24 and the thickness of the wafer 21 can be measured with accuracy. Therefore, the thickness of the wafer 21 can be properly controlled, which improves the in-plane uniformity of the wafer 21.

Further, according to the first preferred embodiment of the present invention, in the method of manufacturing a semiconductor device, the thickness of the protective member 24 is measured at a plurality of points in a radial direction thereof in the step (b). Accordingly, the thickness of the protective member 24 can be measured with accuracy.

Further, according to the first preferred embodiment of the present invention, in the method of manufacturing a semiconductor device, a desired value is set based on an average value of the measurement results at the plurality of points in the step (c). Accordingly, the thickness of the protective member 24 can be measured accurately.

Further, according to the first preferred embodiment of the present invention, in the method of manufacturing a semiconductor device, in the step (c), the wafer 21 is mounted on the suction stage 210 as a stage and is ground with the grinding stone 213 that is disposed as a grinding member on the wafer 21, the method further including the steps of: (d) measuring a thickness distribution in the ground wafer 21; and (e) adjusting, based on the thickness distribution, an arrangement angle of the suction stage 210 with respect to the grinding stone 213. Accordingly, even in a case where the wafer 21 is subsequently subjected to grinding processing, the positional relationship between the suction stage 210 and the grinding stone 213 can be always adjusted to an appropriate state, and the wafer 21 can be repeatedly subjected to grinding with accuracy.

Further, according to the first preferred embodiment of the present invention, in the method of manufacturing a semiconductor device, in the step (d), an upper limit and/or a lower limit of the thickness of the wafer 21 is set in advance, and the thickness distribution in the wafer 21 is measured in a range equal to or smaller than the upper limit and/or equal to or larger than the lower limit. Accordingly, the influence of asperities due to, for example, the pattern formed on the surface of the wafer 21 can be eliminated, which enables thickness control of the wafer 21 in an appropriate manner.

Further, according to the first preferred embodiment of the present invention, in the method of manufacturing a semiconductor device, in the steps (b) and (d), the thickness of the protective member 24 and the thickness distribution in the wafer 21 are measured using film thickness measurement by interference of a front surface and a back surface of a measurement target. Accordingly, the thickness of the wafer 21 can be measured in a non-contact manner with accuracy.

Further, according to the first preferred embodiment of the present invention, in the method of manufacturing a semiconductor device, in the step (c), the wafer 21 is ground while measuring the total thickness of the wafer 21 and the protective member 24 by the contact thickness measuring device 214. Accordingly, grinding can be performed while checking a change in total thickness with respect to the desired value.

Further, according to the first preferred embodiment of the present invention, in the method of manufacturing a semiconductor device, in the steps (b), (c) and (d), the same point of a measurement target is measured a plurality of times, and in a case of a measurement value out of a range set in advance, the measurement value is excluded. Accordingly, the thickness of a measurement target can be measured with higher accuracy.

B. Second Preferred Embodiment (B-1. Configuration)

Figure 7:
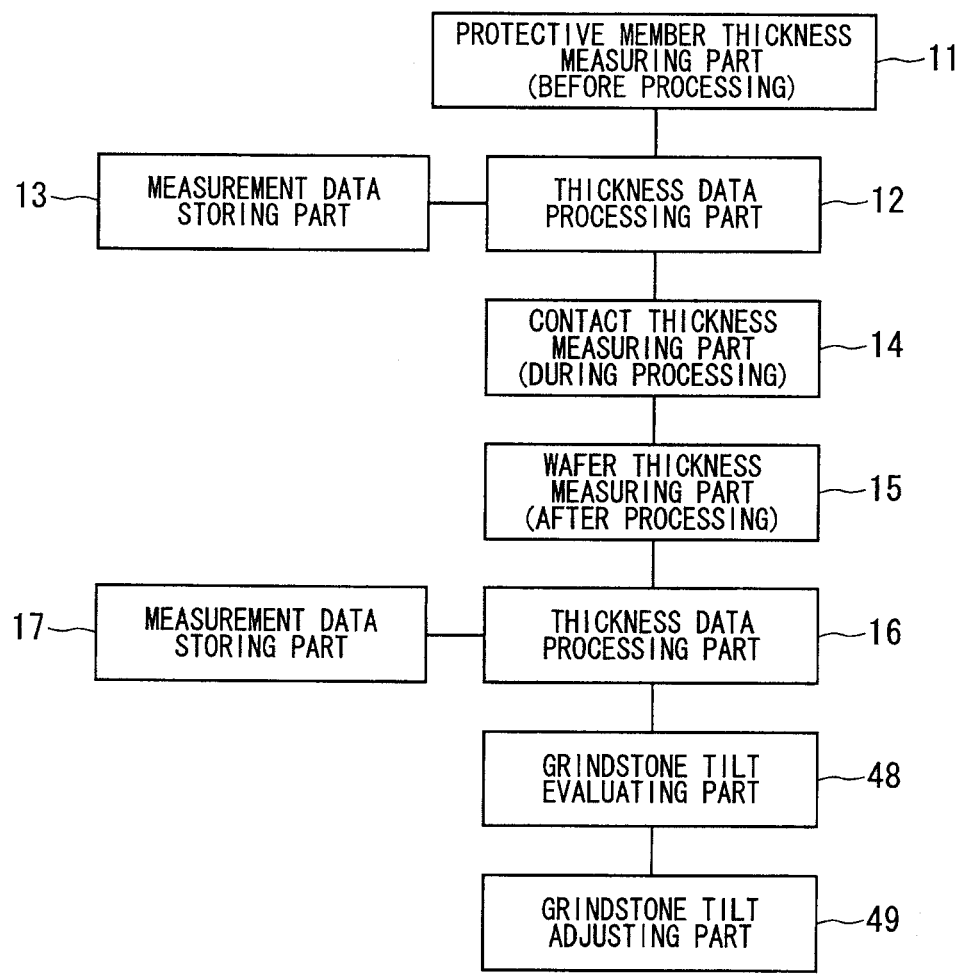
FIG. 7 shows a configuration of a grinding machine that is a semiconductor manufacturing apparatus according to a second preferred embodiment.

FIG. 7 shows the configuration of a grinding machine according to a second preferred embodiment of the present invention. The protective member thickness measuring part 11 to the measurement data storing part 17 according to this preferred embodiment have similar configurations to those of the first preferred embodiment of the present invention, and thus detailed description thereof is omitted. In the second preferred embodiment, there are further provided a grindstone tilt evaluating part 48 that receives an output from the thickness data processing part 16 and a grindstone tilt adjusting part 49 that receives an output from the grindstone tilt evaluating part 48.

(B-2. Operation)

The grindstone tilt evaluating part 48 evaluates the in-plane thickness distribution of the wafer 21 with the use of the wafer average thickness data and wafer thickness distribution data appropriately stored in the measurement data storing part 17. In a case where the width of the thickness distribution exceeds the set value set in advance, for example, the grindstone tilt adjusting part 49 having a similar mechanism to that of the stage tilt adjusting mechanism 215 (see FIG. 4) adjusts the tilt of the grinding wheel 212. That is, an arrangement angle of the grinding stone 213 with respect to the suction stage 210 is adjusted. Here, the grinding stone 213, the suction stage 210 and the wafer 21 are arranged to have the positional relationship as shown in FIG. 4.

Note that the configuration of the second preferred embodiment can be further combined with the stage tilt evaluating part 18 and the stage tilt adjusting part 19 as described in the first preferred embodiment.

(B-3. Effects)

According to the second preferred embodiment of the present invention, the method of manufacturing a semiconductor device further includes the steps of (f) adjusting an arrangement angle of the grinding stone 213 as a grinding member with respect to the suction stage 210 as a stage based on the thickness distribution of the wafer 21, in place of the step (e) adjusting, based on the thickness distribution, an arrangement angle of the suction stage 210 with respect to the grinding stone 213. Accordingly, even in a case where the wafer 21 is subsequently subjected to grinding, the positional relationship between the suction stage 210 and the grinding stone 213 can be adjusted to an appropriate state, which enables continuous grinding processing of the wafer 21 with accuracy.

C. Third Preferred Embodiment (C-1. Configuration)

FIG. 8 shows the configuration of a grinding machine according to a third preferred embodiment of the present invention. The protective member thickness measuring part 11 to the measurement data storing part 17 according to this preferred embodiment have similar configurations as those of the first preferred embodiment of the present invention, and thus detailed description thereof is omitted. In the third preferred embodiment, further, a reflectance evaluating part 58 monitors the intensity of a measurement light beam when the thickness is measured.

(C-2. Operation)

As shown in FIG. 3, as to the light beam entering the surface of the wafer 21 for measuring a thickness, the reflectance evaluating part 58 detects the reflected light beams reflected on the front surface and the back surface of the wafer 21 by, for example, a photodiode, and makes comparison with the intensity of the reflected light beam when a wafer that has been subjected to mirror processing in advance is used.

When the surface roughness of the grinding surface becomes coarse, and the intensity of the detected reflected light beam falls below the set value set in advance, the reflectance determining part 59 determines the degradation of the grinding performance, and stops the processing of the following wafer. With the above-mentioned configuration, it is possible to prevent the processing of the following wafer in the state of the degraded grinding performance. In particular, this configuration is remarkably effective in a case where a wafer material is a difficult-to-cut material and a grindstone is made of silicon carbide which shortens a lifetime thereof.

Note that the configuration of the third preferred embodiment may be further combined with the configurations as described in the first and second preferred embodiments.

(C-3. Effects)

According to the third preferred embodiment of the present invention, the method of manufacturing a semiconductor device further includes the step of: (g) causing the incident light beam 26 to enter the ground wafer 21 and measuring the reflected light beams 27 and 270 thereof; and (h) evaluating grinding performance of the grinding stone 213 as a grinding member based on the intensities of the measured reflected light beams 27 and 270. Accordingly, it is possible to prevent further grinding in the state where the grinding performance is degraded, which enables control of the thickness of the wafer 21 with accuracy.

Further, according to the third preferred embodiment of the present invention, a method of manufacturing a semiconductor device includes the steps of: (a) mounting the wafer 21 on the suction stage 210 as a stage and disposing the grinding stone 213 as a grinding member on the wafer 21 to grind the wafer 21; (b) causing the incident light beam 26 to enter the ground wafer 21 and measuring the reflected light beams 27 and 270 thereof; and (c) evaluating grinding performance of the grinding stone 213 as a grinding member based on the intensities of the measured reflected light beams 27 and 270. Accordingly, it is possible to prevent further grinding in the state in which the grinding performance is degraded, which enables accurate control of the thickness of the wafer 21.

D. Fourth Preferred Embodiment (D-1. Configuration)

FIG. 9 shows the configuration of a grounding machine according to a fourth preferred embodiment of the present invention. The protective member thickness measuring part 11 to the measurement data storing part 17 according to this preferred embodiment have similar configurations as those of the third preferred embodiment of the present invention, and thus detailed description thereof is omitted. In the fourth preferred embodiment, there are provided a shaft current evaluating part 68 that monitors the load applied on the shaft of the grinding stone 213 in grinding and a shaft current determining part 69 that determines the load, and thus a decrease in grinding performance of the grinding stone 213 can be detected.

(D-2. Operation)

Figure 10:
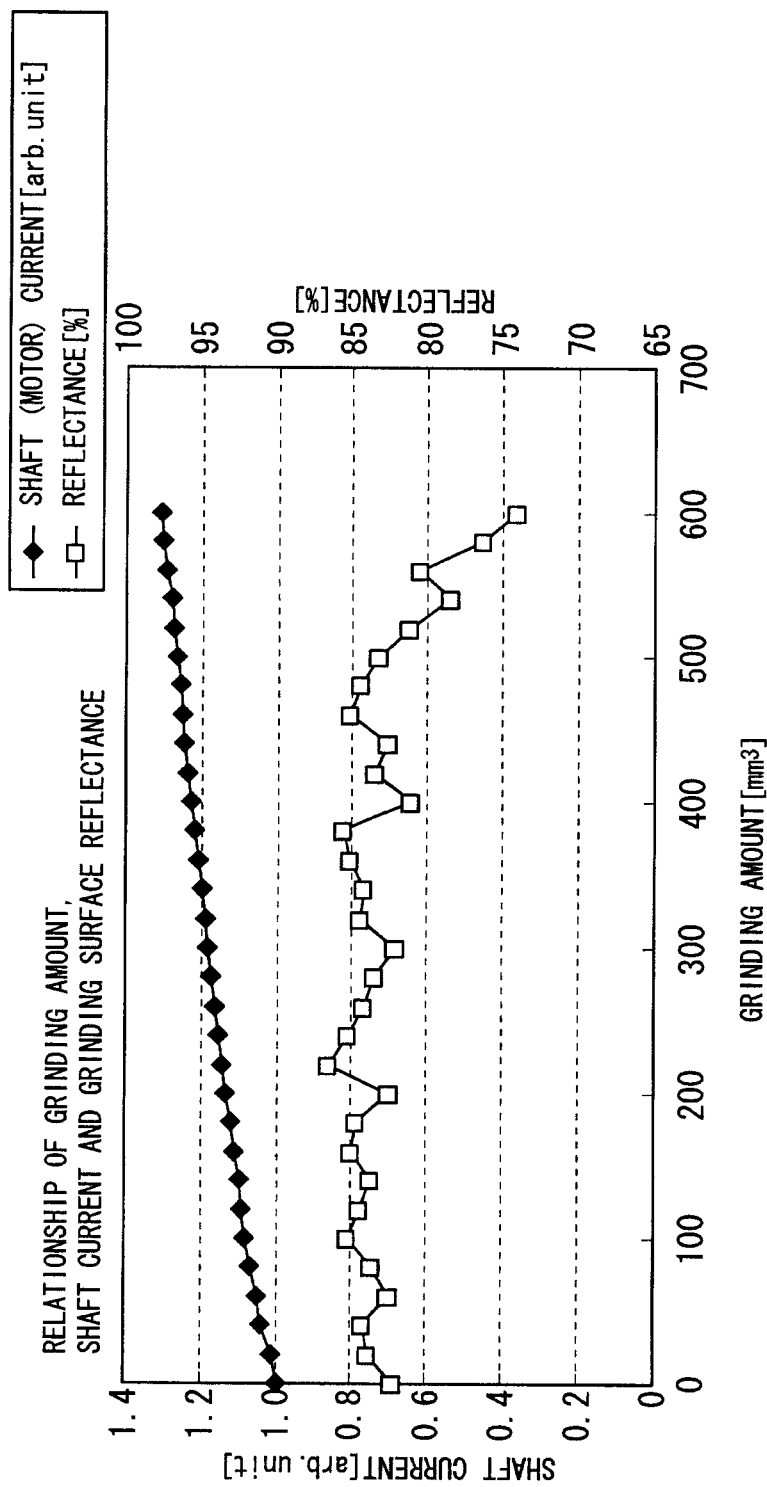
FIG. 10 shows changes of a shaft current and a reflectance along with an amount of grinding in the method of manufacturing a semiconductor device according to the fourth preferred embodiment.

Here, the shaft current refers to the current flowing through a motor that rotates the grinding wheel 212 in grinding of the wafer 21, which has a tendency that a grinding speed of the wafer 21 drops when the grinding performance deteriorates due to, for example, degradation of abrasive grains of the grinding stone 213, and accordingly a shaft current (motor current) increases. FIG. 10 shows changes in shaft current and reflectance along with amounts of grinding in the third and fourth preferred embodiments.

In a case where the shaft current evaluating part 68 detects an increase in shaft current, the shaft current determining part 69 determines the degradation of the grinding performance and stops the processing for the following wafer.

With the above-mentioned configuration, the processing for the following wafer in the state of the degraded grinding performance can be prevented. For example, it is possible to prevent grinding in the state where the grinding stone performance deteriorates by setting an evaluation value of shaft current within 120% of an initial value. In particular, this configuration is remarkably effective in a case where a wafer material is a difficult-to-cut material and a grindstone is made of silicon carbide which shortens a lifetime thereof.

The fourth preferred embodiment may be further combined with the configurations as described in the first, second and third preferred embodiments.

(D-3. Effects)

According to the fourth preferred embodiment of the present invention, the method of manufacturing a semiconductor device further includes the steps of: (i) measuring a shaft current for rotating the grinding stone 213 as a grinding member; and (j) evaluating grinding performance of the grinding stone 213 based on the magnitude of the measured shaft current. Accordingly, it is possible to prevent further grinding in the state in which the grinding performance deteriorates, which enables control of the thickness of the wafer 21 with accuracy.

Further, according to the fourth preferred embodiment of the present invention, a method of manufacturing a semiconductor device includes the steps of: (a) mounting the wafer 21 on the suction stage 210 as a stage and disposing the grinding stone 213 as a rotatable grinding member on the wafer 21 to grind the wafer 21; (b) measuring a shaft current for rotating the grinding stone 213; and (c) evaluating grinding performance of the grinding stone 213 based on the magnitude of the measured shaft current. Accordingly, it is possible to prevent further grinding in the state of the degraded grinding performance, which enables accurate control of the thickness of the wafer 21.

E. Fifth Preferred Embodiment

Figure 11:
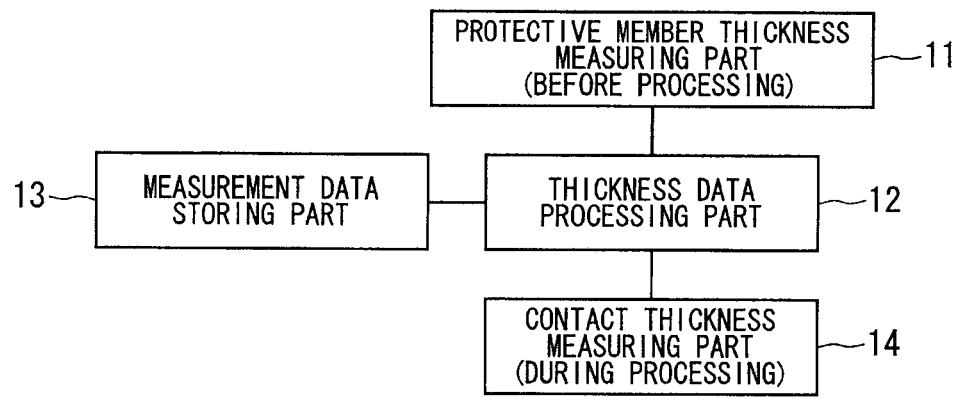
FIG. 11 shows a configuration of a grinding machine that is a semiconductor manufacturing apparatus according to a fifth preferred embodiment.

FIG. 11 shows the grinding process according to a fifth preferred embodiment of the present invention. The configuration is made by the protective member thickness measuring part 11, the thickness data processing part 12, the measurement data storing part 13 and the contact thickness measuring part 14 that are described in the first preferred embodiment of the present invention, whereby it is possible to eliminate the effects of the unevenness in thickness distribution of the protective member 24 with a simple configuration in a case where the width of the thickness distribution of the protective member 24 increases.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
   (a) preparing a processing target including a wafer and a protective member formed on said wafer;
   (b) measuring a thickness of said protective member at a plurality of points along a diameter of said protective member and at another different point along a circumference of said protective member; and
   (c) setting a desired value of a total thickness of said wafer and said protective member based on measurement results at said plurality of points and said another different point to grind said wafer in accordance with said desired value, said desired value being set based on an average value of the measurement results at said plurality of points and said another different point.

2. The method of manufacturing a semiconductor device according to claim 1, wherein in said step (c), said wafer is mounted on a stage and is ground with a grinding member disposed on said wafer, the method further comprising the steps of:
   (d) measuring a thickness distribution in said ground wafer; and
   (e) adjusting, based on said thickness distribution, an alignment between said stage and said grinding member.

3. The method of manufacturing a semiconductor device according to claim 2, wherein in said step (d), at least one of an upper limit and a lower limit of the thickness of said wafer is set in advance, and the thickness distribution in said wafer is measured in a range that is at least one of equal to or smaller than said upper limit and equal to or larger than said lower limit.

4. The method of manufacturing a semiconductor device according to claim 2, further comprising the steps of:
   (g) causing a light beam to enter said ground wafer and measuring reflected light beams thereof; and
   (h) evaluating grinding performance of said grinding member based on intensities of said measured reflected light beams.

5. The method of manufacturing a semiconductor device according to claim 2, further comprising the steps of:
   (i) measuring a shaft current for rotating said grinding member; and
   (j) evaluating grinding performance of said grinding member based on the magnitude of said measured shaft current.

6. The method of manufacturing a semiconductor device according to claim 2, wherein in said steps (b) and (d), the thickness of said protective member and the thickness distribution in said wafer are measured using film thickness measurement by light interference of a front surface and a back surface of a measurement target.

7. The method of manufacturing a semiconductor device according to claim 2, wherein in said step (c), said wafer is ground while measuring the total thickness of said wafer and said protective member by a contact thickness measuring device.

8. The method of manufacturing a semiconductor device according to claim 7, wherein in said steps (b), (c) and (d), the same point of a measurement target is measured a plurality of times, and in a case of a measurement value out of a range set in advance, the measurement value is excluded.

* * * * *